US011340256B2

(12) United States Patent
Bunton et al.

(10) Patent No.: US 11,340,256 B2
(45) Date of Patent: May 24, 2022

(54) ENERGY BEAM INPUT TO ATOM PROBE SPECIMENS FROM MULTIPLE ANGLES

(71) Applicant: CAMECA INSTRUMENTS INC., Madison, WI (US)

(72) Inventors: Joseph Hale Bunton, Madison, WI (US); Daniel Robert Lenz, Stoughton, WI (US); Dana Jeffrey Shepard, Fitchburg, WI (US)

(73) Assignee: Cameca Instruments, Inc., Madison, WI (US)

( * ) Notice: Subject to any disclaimer, the term of this patent is extended or adjusted under 35 U.S.C. 154(b) by 670 days.

(21) Appl. No.: 16/319,620

(22) PCT Filed: Jan. 31, 2018

(86) PCT No.: PCT/US2018/016217
§ 371 (c)(1),
(2) Date: Jan. 22, 2019

(87) PCT Pub. No.: WO2019/152018
PCT Pub. Date: Aug. 8, 2019

(65) Prior Publication Data
US 2021/0333306 A1    Oct. 28, 2021

(51) Int. Cl.
H01J 37/285    (2006.01)
G01Q 60/30     (2010.01)
G01N 27/626    (2021.01)
G01N 27/66     (2006.01)
G01Q 60/38     (2010.01)

(52) U.S. Cl.
CPC .......... *G01Q 60/30* (2013.01); *G01N 27/628* (2013.01); *G01N 27/66* (2013.01); *G01Q 60/38* (2013.01); *H01J 37/285* (2013.01)

(58) Field of Classification Search
CPC ..................... H01J 37/285; G01N 27/628
See application file for complete search history.

(56) References Cited

U.S. PATENT DOCUMENTS

| 7,652,269 | B2  |    | 1/2010  | Bunton   |            |
|-----------|-----|----|---------|----------|------------|
| 8,670,608 | B2  |    | 3/2014  | Kelly    |            |
| 9,816,939 | B2  |    | 11/2017 | Duffy et al. |        |
| 10,416,088 | B2 |    | 9/2019  | Duffy et al. |        |
| 10,614,995 | B2 | *  | 4/2020  | Kelly .......... | H01J 37/18 |
| 2007/0181826 | A1 | * | 8/2007  | Bunton ........... | H01J 49/0004 |
|           |     |    |         |          | 250/491.1  |

(Continued)

FOREIGN PATENT DOCUMENTS

WO    WO 2016014714 A1    1/2016

*Primary Examiner* — Wyatt A Stoffa
(74) *Attorney, Agent, or Firm* — Craig A. Fieschko, Esq.; DeWitt LLP

(57) ABSTRACT

An atom probe directs two or more pulsed laser beams onto a specimen, with each laser beam being on a different side of the specimen, and with each laser beam supplying pulses at a time different from the other laser beams. The laser beams are preferably generated by splitting a single beam provided by a laser source. The laser beams are preferably successively aligned incident with the specimen by one or more beam steering mirrors, which may also scan each laser beam over the specimen to achieve a desired degree of specimen ionization.

20 Claims, 5 Drawing Sheets

(56) References Cited

U.S. PATENT DOCUMENTS

| | | | |
|---|---|---|---|
| 2007/0205358 A1* | 9/2007 | Bunton | H01J 37/285 250/282 |
| 2010/0148060 A1 | 6/2010 | Panayi | |
| 2010/0282964 A1* | 11/2010 | Bunton | H01J 37/285 250/282 |
| 2010/0321693 A1 | 12/2010 | Cho et al. | |

* cited by examiner

ENERGY BEAM INPUT TO ATOM PROBE SPECIMENS FROM MULTIPLE ANGLES

FIELD OF THE INVENTION

This document concerns an invention relating generally to atom probes, and more specifically to atom probes which provide ionization energy beams to atom probe specimens from multiple angles about the specimens.

BACKGROUND OF THE INVENTION

An atom probe, also referred to as an atom probe microscope, is a device which allows specimens to be analyzed on an atomic level. A typical atom probe includes a specimen mount and a detector. During typical analysis, a specimen is situated in the specimen mount and a positive electrical charge (e.g., a baseline voltage) is applied to the specimen such that the electrostatic field near the apex of the specimen (the surface closest to, and facing, the detector) is approximately 90% of that required to spontaneously ionize surface atoms (generally on the order of 5 to 50 volts per nanometer). The detector is spaced from the apex (tip) of the specimen and is either grounded or negatively charged. A local electrode may be located between the specimen and the detector, having an aperture aligned between the specimen and the detector, and the local electrode may be either grounded or negatively charged. (The local electrode is sometimes referred to as a "local electrode" or "extraction electrode"; additionally, because electrodes in an atom probe typically serve as electrostatic lenses, the term "lens" is sometimes used in place of the term "electrode.") An energy beam pulse (e.g., a laser beam pulse, electron beam pulse, ion beam pulse, etc.), positive electrical pulse (above the baseline voltage), and/or other energy pulse (e.g., RF pulse) is intermittently applied to the specimen to increase the probability that surface atoms on the specimen will ionize. Alternatively or additionally, a negative voltage pulse can be applied to any local electrode in synchrony with the foregoing energy pulse(s).

Occasionally, a pulse will cause ionization of a single atom near the apex of the specimen. The ionized atom(s) separate or "evaporate" from the specimen's surface, pass through the aperture in the local electrode (if present), and impact the surface of the detector, typically a microchannel plate (MCP). The elemental identity of an ionized atom can be determined by measuring its time of flight (TOF), the time between the pulse that liberates the ion from the surface of the specimen and the time it impinges on the detector. The velocity of the ions (and thus their TOF) varies based on the mass-to-charge-state ratio (m/n) of the ionized atom, with lighter and/or more highly charged ions taking less time to reach the detector. Since the TOF of an ion is indicative of the mass-to-charge ratio of the ion, which is in turn indicative of elemental identity, the TOF can help identify the composition of the ionized atom. In addition, the atom probe acts as a "point projection microscope" whereby the location of the ionized atom on the surface of the specimen corresponds to the location of the atom's impact on the detector, thereby allowing determination of the ionized atom's original location on the specimen. Thus, as the specimen is evaporated, a three-dimensional map or image of the specimen's constituent atoms can be constructed. While the image represented by the map is a point projection, with atomic resolution and a magnification of over 1 million times, the map/image data can be analyzed in virtually any orientation, and thus the image can be considered more tomographic in nature. Further details on atom probes can be found, for example, in U.S. Pat. Nos. 5,440,124; 7,157,702; 7,652,269; 7,683,318; 7,884,323; 8,074,292; 8,153,968; 8,276,210; 8,513,597; 8,575,544; and U.S. Patent Appl'n. Publ'n. 2012/0080596, as well as in the patents and other literature referenced in the foregoing documents.

The use of energy beams, particularly laser beams, to trigger ionization has become increasingly popular, spawning a subcategory of atom probe microscopy called Pulsed Laser Atom Probe (PLAP) microscopy. This growth in popularity is largely owing to advances in reliable laser systems with ultra-short pulse width and high pulse repetition rate. Shorter pulse width allows greater precision in identifying the moment of ionization, and thereby allows the ion time of flight to be identified with higher resolution. Higher pulse rate allows higher ionization rates, and thus lesser time for complete analysis of a specimen. However, pulsed laser methods face challenges arising from the laser beam's uneven heating of the specimen, with the directly illuminated portion of the specimen heating more than the shadowed portion of the specimen. Atoms on the illuminated side of the sample can therefore be more readily ionized by the laser, leading to greater evaporation at the illuminated portion, which can produce artefacts in the image of the specimen generated by the detector.

U.S. Pat. Nos. 7,652,269, 7,683,318, and 8,153,968 address the problem of uneven heating by directing the laser onto the specimen along an axis which is as close as possible to (but outside of) the "flight cone" defined by ions travelling from the specimen to the detector, thereby more fully and evenly illuminating the apex of the specimen. While this approach reduces the problem of uneven heating, it unfortunately tends to require that the laser be situated further from the specimen, which enhances "drift" in the laser beam owing to vibration, laser imperfections, thermal expansion/contraction of components, etc. Such drift gives rise to the need for frequent and time-consuming realignment and refocusing of the laser beam onto the specimen (see, e.g., U.S. Published Patent Application 2010/0282964). The aforementioned documents propose that drift be addressed by periodically scanning the laser beam about the specimen, and monitoring parameters indicative of the specimen's ionization rate while doing so. When ionization rate is maximized, this typically indicates that the specimen apex, or a region close to the apex, is being illuminated. Thus, the laser is periodically realigned/refocused onto the specimen apex.

Other approaches for reduction of uneven heating are largely unsatisfactory. Illuminating the specimen from multiple sides simultaneously, using multiple lasers, is cumbersome and impractical. Consider the simple example of two lasers on opposite sides of a specimen, each having its beam focused onto the (typically sub-micron) specimen apex by a corresponding objective lens. The goal is to send a laser pulse through both lenses simultaneously, and thereby provide ionization energy to opposing sides of the specimen simultaneously. While the lasers might be situated closer to the specimen than in the arrangement discussed above, their beams must still frequently be swept about the specimen to compensate for drift. The alignment of the beams must be simultaneously controlled in two dimensions (corresponding to the height and width of the specimen). Further, if the beams are to be tightly focused about the area of the specimen under analysis, each must have its beam focus actively controlled. The pulse timing (both laser and electrical) may also need to be controlled to ensure that the pulses arrive at exactly the same time. At a minimum, four variables must be controlled; at most, seven variables must be controlled. If it takes as long as $t_s$ to scan a single variable (i.e., to determine its status and adjust to a desired/optimal value), the maximum time required to scan n variables is $t_s^n$. If a conventional two-variable scan takes a maximum of $5^2=25$ seconds, then a four variable scan with equivalent granularity will require a maximum of 54=625 seconds. Extending this further, a seven variable scan may take over 200 hours, which is longer than the duration of a typical atom probe experiment. Ultimately, if the number of scanned variables increases beyond two or three, the scans can become too long to be useful.

Moreover, the additional equipment required for simultaneous multi-beam pulsing incurs significant cost. The beam steering mirrors needed to vary beam alignment are particularly expensive (at least as of the year 2017), and since at least one such mirror is needed for each beam, equipment costs alone can be a deterrent to multi-beam pulsing.

Another challenge with simultaneously pulsing the specimen with a laser beam from multiple sides arises from the wave nature of light. When the beams illuminate the same area of a specimen, they may constructively or destructively interfere with one another, resulting in the specimen receiving either too much or too little energy. If the optical path varies by approximately 50 to 100 nanometers in length, the beams could vary between complete destructive interference and complete constructive interference at the specimen location, thereby making the process very difficult to control.

Another option is to delay successive pulses by a few picoseconds in order to eliminate any possible interference. For example, consider two laser pulses traveling towards the specimen from opposing sides, with each pulse having a temporal width of 1 ps. If the pulses are staggered by a few picoseconds, they will not be able to interfere at the specimen, but they will still be close enough in time that they can effectively be treated as a single pulse. (At least when using equipment that is state of the art as of 2017; as of 2017, the timing resolution of an atom detector is on the order of 50 ps, and thus any delay less than that will not be visible in the recorded mass spectra.) However, this arrangement can still take an undesirably long time to implement, as there are still at least four scan variables (those for beam alignment). This arrangement also suffers from the high equipment costs noted above.

SUMMARY OF THE INVENTION

The invention involves atom probe arrangements which provide energy beams, e.g., laser beams, to atom probe specimens from multiple angles (that is, to multiple sides of a specimen), and at least partially solve some of the aforementioned problems. To give the reader a basic understanding of some of the advantageous features of the invention, following is a brief summary of preferred versions of the arrangements, with reference being made to the accompanying drawings to assist the reader's understanding (and with the drawings being briefly described in the following "Brief Description of the Drawings" section of this document). Since the following discussion is merely a summary, it should be understood that more details regarding the preferred versions may be found in the Detailed Description set forth elsewhere in this document. The claims set forth at the end of this document then define the various versions of the invention in which exclusive rights are secured.

Preferred versions of the invention use the realization that uneven specimen heating doesn't need to be eliminated in order to eliminate data artefacts. Rather than supplying energy beams to the specimen simultaneously at multiple selected sides, the selected sides of the specimen can be sequentially supplied with energy, preferably with each side receiving multiple pulses of the energy beam before a subsequent side receives multiple pulses of an energy beam. To reduce artefacts, the sides should be switched sufficiently often that the specimen does not significantly reshape from one side to the next. As an example, there are approximately $10^5$ atoms per atomic layer on a typical atom probe specimen, so each side might receive energy beam pulses sufficient to evaporate approximately $10^5$ atoms before a subsequent side is similarly pulsed. This equates to approximately 10 seconds of acquisition time in a state-of-the-art atom probe as of the year 2017.

Sequential beam input separates the scanning variables for each beam, that is, only the scanning variables of the beam in use at any given time need be scanned. The total scan time is now given by $L*t_s^p$, where L is the number of beams and p is the number of variables per beam. From examples above, consider two beams having two scan variables each (x and y). The time required to scan this system, assuming the same 5 second $t_s$ scan time for each variable, is $2*5^2=50$ seconds. Thus, a two beam system can be scanned more than 10 times faster when beam input is provided sequentially rather than simultaneously.

Some versions of the invention also preferably use an energy beam arrangement which redirects and/or splits an energy beam from a single energy beam source (e.g., a laser) such that the resulting sub-beams are supplied to the multiple sides, thereby eliminating the need for multiple energy beam sources. For example, where the energy beam source is a laser, the laser beam may be provided to a beamsplitter to split the beams into sub-beams which travel along different sub-beam paths, with the different sub-beam paths being simultaneously directed toward a specimen within an atom probe chamber. With appropriate arrangement of optical elements (mirrors, lenses, beam strength adjusters, etc.), the different sub-beams can be directed toward a different side of the specimen, but only a selected one of the sub-beams might illuminate the specimen at a given time. For example, optical elements can be situated such that repositioning one or more beam steering mirrors can selectively situate one of the sub-beams onto the specimen while the others are situated slightly off of the specimen, whereby the mirror(s) can situate different sub-beams onto the specimen in succession. As another example, all sub-beams may each be directed toward a respective different side of the specimen at the same time, and different sub-beams may be selectively blocked from transmission to the specimen at different times by beam strength adjusters situated in their paths (e.g., variable attenuators, mechanical shutters, acousto-optical modulators, electro-optic modulators, neutral density filters, wave plates/polarizing cubes, or other beam-blocking or beam-attenuating devices). Beam strength adjusters along the paths of the different sub-beams might also or alternatively be used to adjust the strengths of the different sub-beams, e.g., to better achieve approximately equal specimen ionization rates from each sub-beam, to thereby better ensure that the different sides erode at the same rate.

To briefly summarize exemplary versions of the invention in greater detail, FIGS. 1 and 4 show an atom probe arrangement including a laser beam source 100, and a beam splitter 102/202 situated to receive a laser beam from the laser beam source 100 along a beam path, and to split the laser beam into sub-beams which travel along different sub-beam paths. These different sub-beam paths are directed toward a specimen 12 within an atom probe chamber 10. However, only one of the sub-beams is incident on the specimen 12 at a time, as by adjusting a beam steering mirror 104/204/226 such that at a first time, a first one of the sub-beams is incident on the specimen 12, and a second one of the sub-beams is not incident on the specimen; and at a second time following the first time, the first one of the sub-beams is not incident on the specimen, and the second one of the sub-beams is incident on the specimen 12. Thus, when the steering mirror(s) 104/204/226 selectively direct the sub-beam path of any selected one of the sub-beams onto the specimen, such repositioning directs the sub-beam paths of the other sub-beams off of the specimen. Simple repositioning of the beam steering mirror(s) 104/204/226 therefore implements ion evaporation from different sides of the specimen 12 in succession. While FIGS. 1 and 4 show the sub-beams directed toward the opposite sides of the specimen 12, the sub-beams need not be oriented 180 degrees from each other about the specimen. Different arrangements may have a different location and number of optical elements (mirrors, lenses, beam strength adjusters, etc.) such that a different number of sub-beams are directed toward the specimen 12, and/or such that sub-beams are differently spaced about the specimen (preferably by more than 90 degrees, and most preferably having at least substantially equal angular separation about the specimen).

The atom probe arrangement also preferably includes an ion detector 14 configured to measure ion evaporation from the specimen 12. A processor 105/205 is configured to monitor ion evaporation measurements while the beam steering mirror(s) 104/204/226 scan the sub-beam incident on the specimen 12 about an area of the specimen 12, and seek a sub-beam orientation having desired ion evaporation measurements (preferably maximum ion evaporation measurements). The processor 105/205 may adjust the energy of at least one of the sub-beams to seek equal ion evaporation measurements resulting from all sub-beams incident on the specimen 12. In this manner, the specimen 12 should erode evenly on all sides. The energy of a sub-beam can be adjusted, for example, by adjusting the output of the laser beam source 100, or by attenuating a sub-beam via a beam strength adjuster (e.g., variable attenuator 236 in FIG. 4) situated along one of the sub-beam paths, with the beam strength adjuster providing adjustable sub-beam attenuation.

The invention also encompasses methods for collecting atom probe data. A preferred method includes the steps of splitting a laser beam into sub-beams which travel along different sub-beam paths, and directing the sub-beams toward a specimen 12 within an atom probe chamber 10, with only one of the sub-beams being incident on the specimen 12 at a time (and with different sub-beams falling incident on the specimen 12 over time). The method also preferably includes the steps of scanning each sub-beam over an area of the specimen 12, and monitoring ion evaporation from the specimen 12 during the scanning. Other methods further involve practice of the steps implemented by the atom probe arrangement discussed above.

Further advantages, features, and objects of the invention will be apparent from the remainder of this document in conjunction with the associated drawings.

DETAILED DESCRIPTION OF EXEMPLARY VERSIONS OF THE INVENTION

The aforementioned exemplary versions of the invention will now be described in greater detail. In these versions, a single energy beam source supplies an energy beam which is split into multiple sub-beams, with the sub-beams successively supplying energy pulses to the specimen. In the following examples, the energy beam is exemplified by a laser beam which is manipulated by optical elements (lenses, mirrors, attenuators, etc.), but it should be understood that the invention may use other types of energy beams manipulated by other types of suitable manipulation elements.

Figure 1:
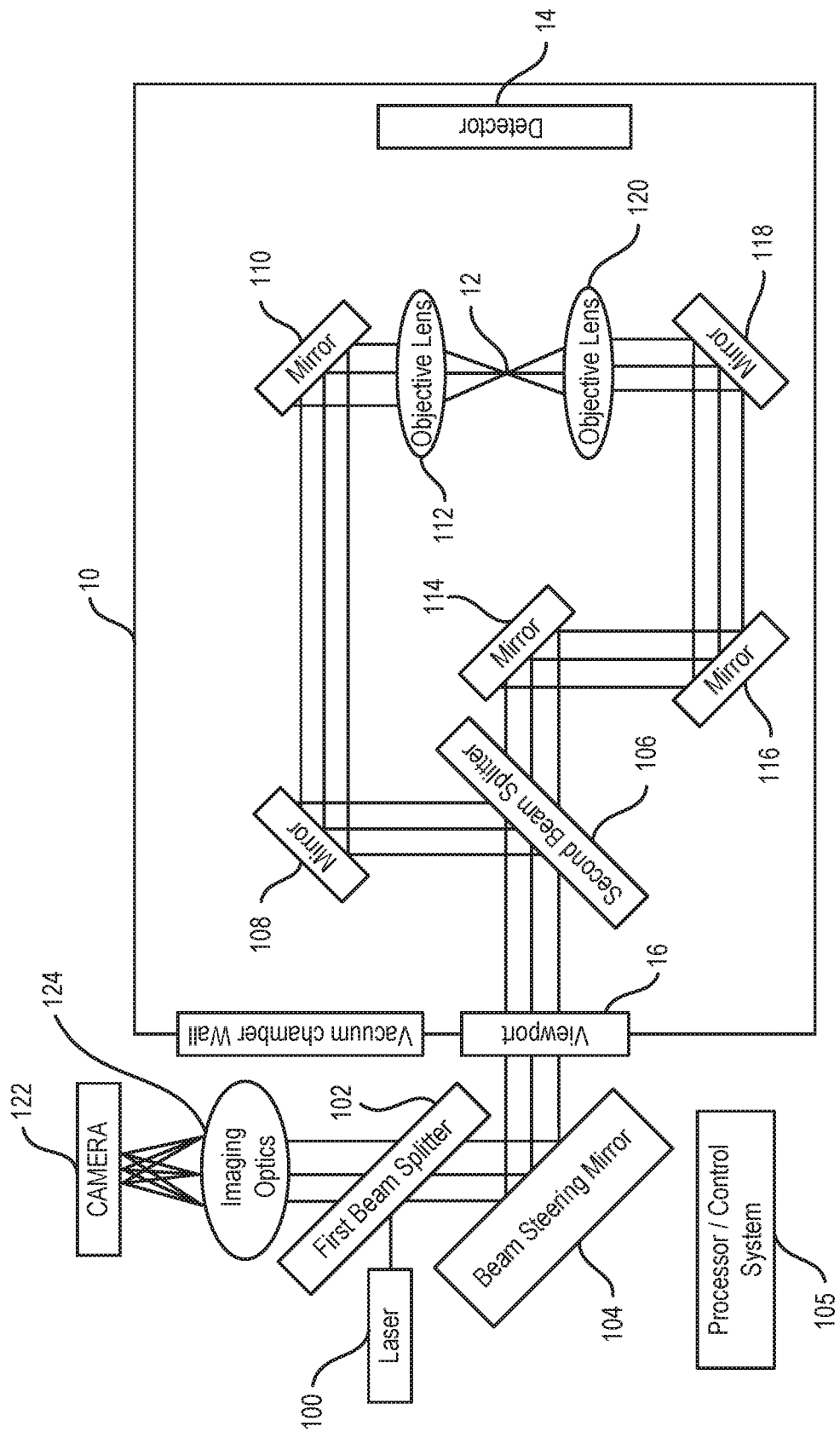
FIG. 1 is a simplified schematic view of a first exemplary atom probe arrangement illustrating concepts of the invention.

Referring to FIG. 1 for a simplified schematic view of a first exemplary version of the invention, an atom probe vacuum chamber 10 contains a specimen 12 and a detector 14. A laser 100 situated outside the chamber 10 supplies ionizing laser energy to the specimen 12 through a viewport 16 in a wall of the chamber 10. A portion of the output beam of the laser 100 is reflected from a first beam splitter 102, with the remainder (not shown) passing through the first beam splitter 102, and here not being shown or used. The reflected beam then reflects from a beam steering mirror 104, which is controlled by the atom probe's control system 105 to be rapidly and finely repositionable. The beam then passes through the viewport 16 to again be split (preferably into sub-beams of equal energy) at a second beam splitter 106. One sub-beam is then directed by mirrors 108 and 110 toward the specimen 12 through an objective lens 112 which preferably brings the sub-beam to a tight focus of only a few microns in diameter. (Here it should be understood that where reference is made to directing a sub-beam "toward" an object, this indicates that the sub-beam is oriented in the general direction of the object, but is not necessarily incident on the object. Thus, the sub-beam may not be incident on the specimen 12, for reasons which will soon be apparent.) The other sub-beam is similarly directed by mirrors 114, 116, and 118 toward the specimen 12 (but again, not necessarily being incident on the specimen 12) through an objective lens 120, which also preferably brings its sub-beam to a tight focus of only a few microns in diameter. The optical axes of the objective lenses 112 and 120 preferably intersect not on the specimen 12, but slightly offset from the specimen 12 (here, slightly above the specimen 12). In this arrangement, the various optical elements (lenses and mirrors) within the chamber 10 are preferably fixed in place, and the specimen 12 is appropriately positioned with respect to the optical elements and their sub-beam paths using micropositioning stages.

Figure 2:
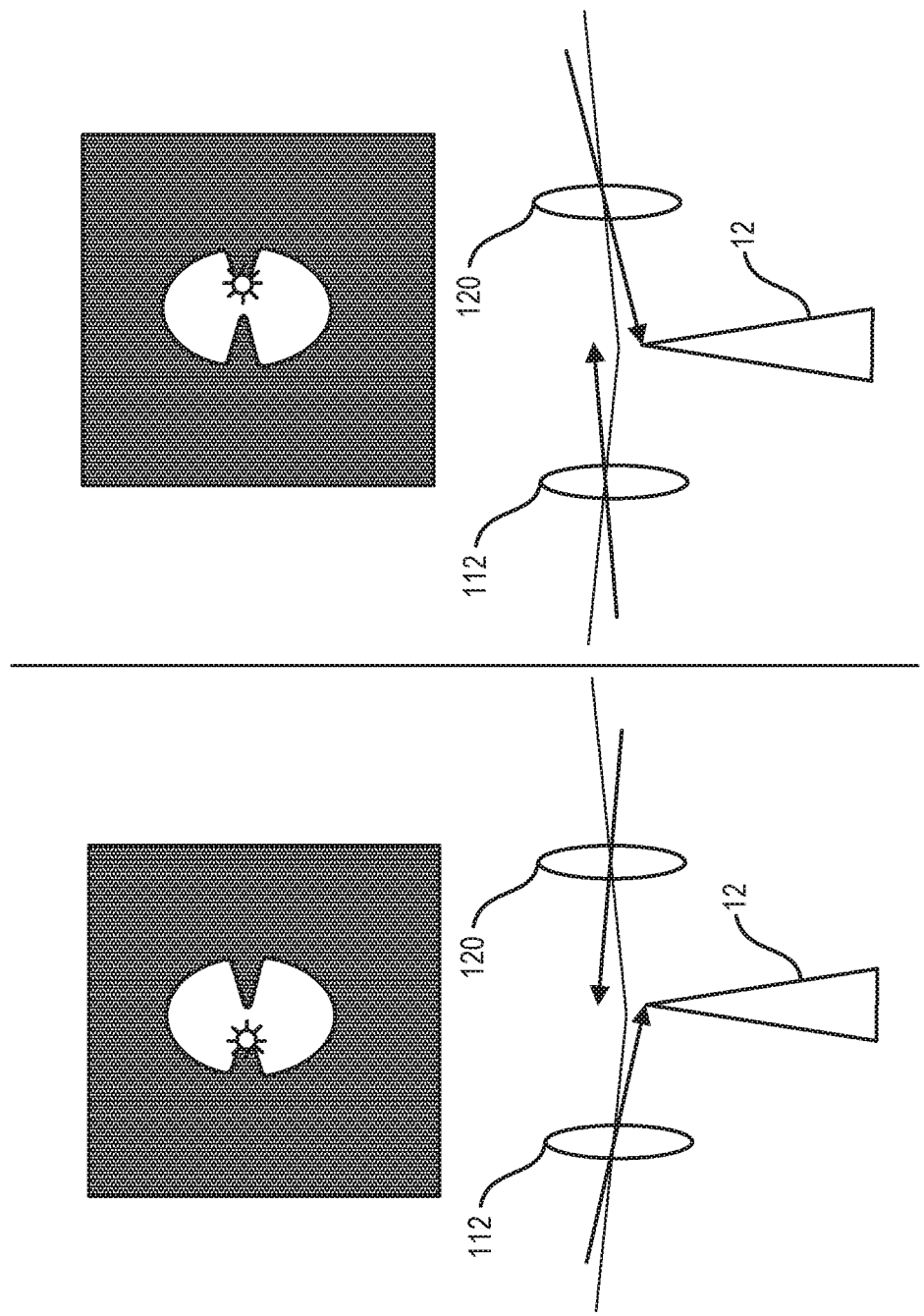
FIG. 2 is (at top) a schematic view of the specimen 12 as seen by the camera 122 of FIG. 1, and (at bottom) a corresponding simplified schematic view of the sub-beams being alternately moved incident on the specimen 12 by the beam steering mirror 104 of FIG. 1.

Comparing the two sub-beam paths, the different numbers of sub-beam reflections along the paths result in the sub-beam of one path being inverted with respect to the other. Otherwise, both paths are essentially equivalent. The inversion is used to attain the arrangement shown in FIG. 2, the top of which shows the image of the specimen 12 as received by the camera 122 of FIG. 1 through imaging optics 124: because the specimen 12 is reflected back through the sub-beam paths (one beam being inverted with respect to the other), and then combined at the second beam splitter 106, the image received by the camera 122 through the first beam splitter 102 depicts the specimen 12 twice, with one image inverted with respect to the other. The bottom of FIG. 2 shows the beam alignment resulting from pivoting of the beam steering mirror 104 in the appropriate direction by the appropriate amount: as seen at left, when the first sub-beam is aligned with the specimen 12, the second sub-beam passes over the specimen. Likewise, as shown at right, when the second sub-beam is aligned with the specimen 12, the first sub-beam passes over the specimen. If the beam steering mirror 104 is oriented such that both of the sub-beams are aligned along the optical axes of their objective lenses, the image received by the camera 122 would show the laser spot situated between the specimen images.

Thus, different sides of the specimen 12 may be illuminated using a single laser 100 and a single beam steering mirror 104. More particularly, the beam steering mirror 104 can be positioned so that one of the sub-beams supplies some number of pulses to one of the sides of the specimen 12—for example, sufficient pulses to remove one atomic layer. The other sub-beam is not incident on the specimen 12, and thus has no effect. The beam steering mirror 104 can then be repositioned so that the other sub-beam supplies pulses to the other side of the specimen 12, with the first sub-beam then missing the specimen 12 to no effect.

Figure 3:
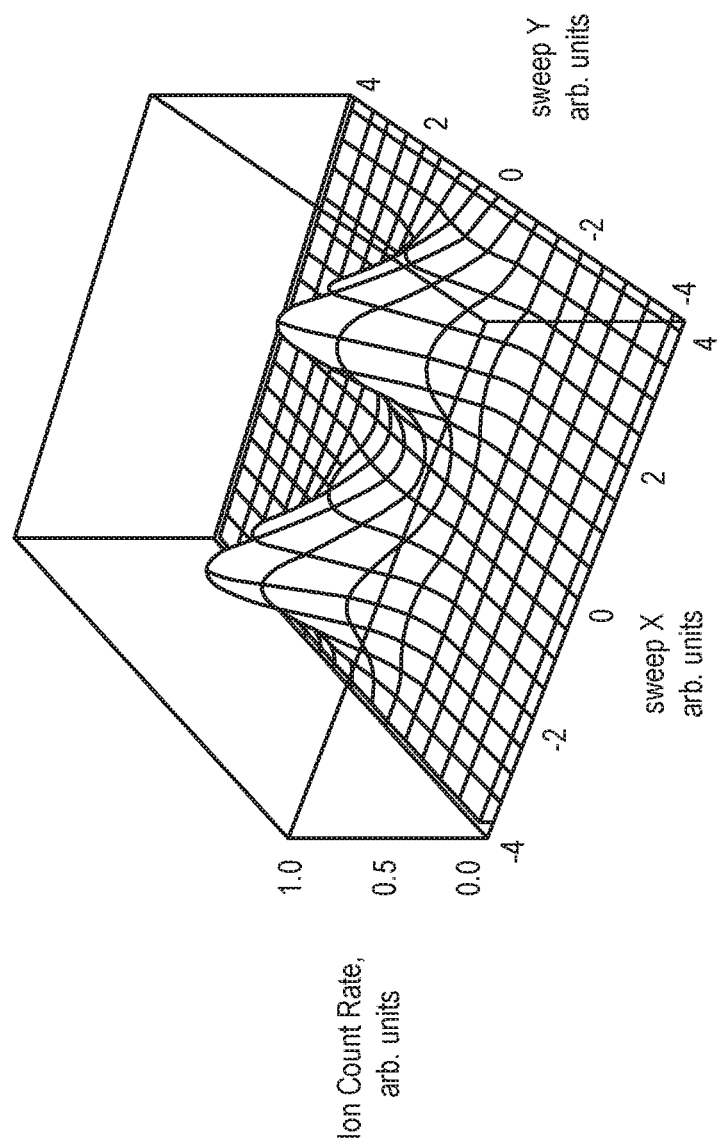
FIG. 3 is an exemplary plot of ion evaporation rate versus sub-beam position, showing a peak in ion evaporation for each of the sub-beams.

Moreover, with finer adjustment of the beam steering mirror 104, each sub-beam may be precisely aligned as desired with respect to the specimen 12. This allows each sub-beam to be independently swept about the specimen 12, with the atom probe's control system 105 monitoring parameters indicative of the specimen's ionization rate while doing so (as discussed in the aforementioned U.S. Pat. Nos. 7,652,269, 7,683,318, and 8,153,968). Each sub-beam will exhibit its own independent ionization rate vs. beam position characteristics, with an exemplary plot of ionization rate vs. beam position for two sub-beams being shown in FIG. 3. In this plot, the XY coordinates of the peaks in the plots reflect the most effective location/orientation for each sub-beam. Ideally, the peaks (i.e., optimum ionization rates) have roughly the same height, meaning that both sides of the specimen 12 evaporate at roughly the same rate. If this does not naturally occur, the atom probe's control system 105 might adjust peak height by adjusting the energy of the laser 100, and/or by reducing the energy of one or both of the sub-beams via a variable attenuator (not shown) situated along its path.

Figure 4:
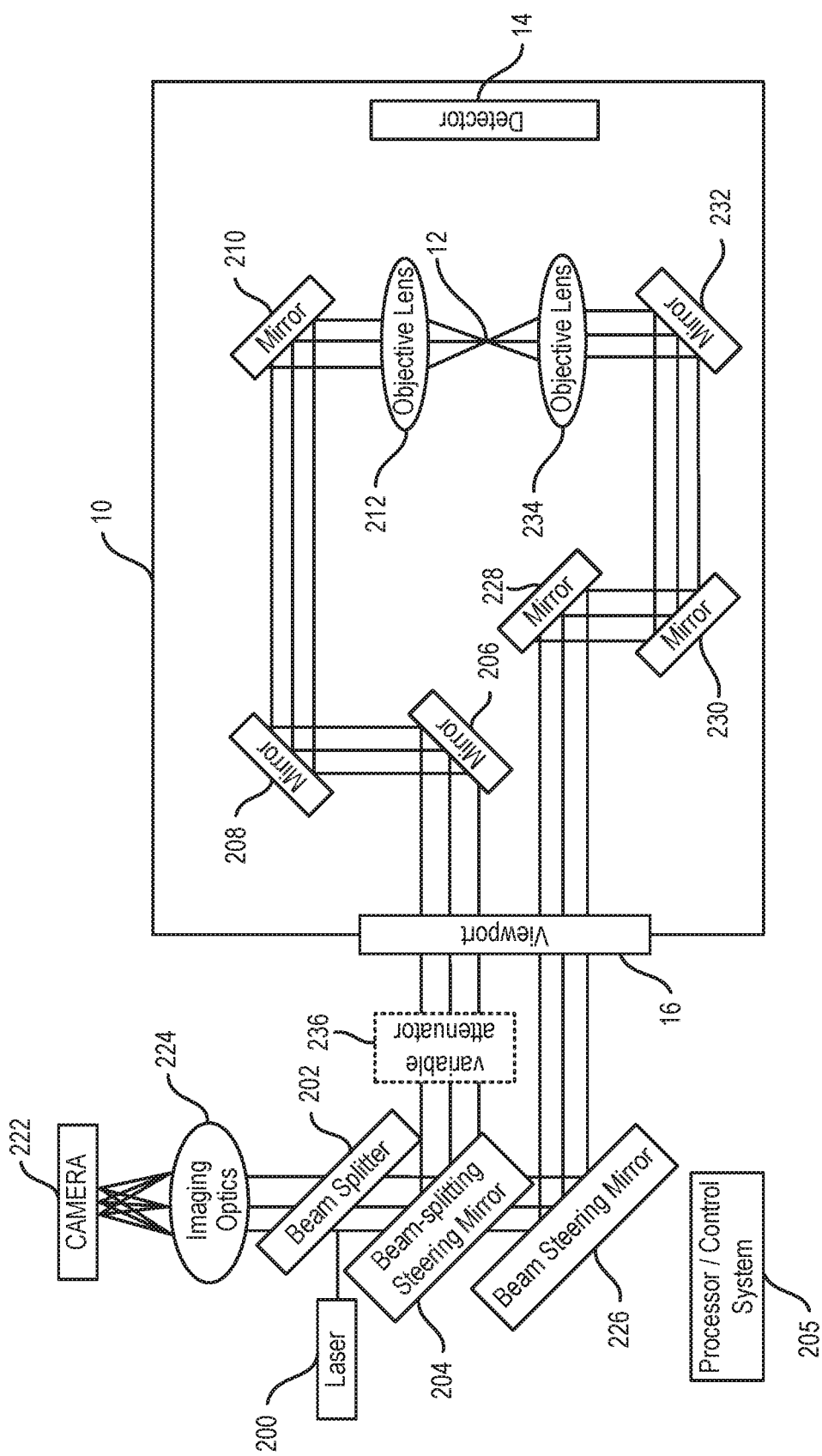
FIG. 4 is a simplified schematic view of a second exemplary atom probe arrangement illustrating concepts of the invention.

FIG. 4 depicts another exemplary version of the invention which differs from that of FIG. 2, primarily insofar as each sub-beam is provided with its own beam steering mirror. A laser 200 situated outside the chamber 10 supplies laser energy to the specimen 12 through a viewport 16 in a wall of the chamber 10. A portion of the output beam of the laser 200 is reflected from a beam splitter 202 to a beam-splitting steering mirror 204, which preferably reflects a larger portion of the laser energy (e.g., 60%) and passes a smaller portion (e.g., 40%). The resulting sub-beam passes through a variable attenuator 236 and the viewport 16, and is directed by mirrors 206, 208, and 210 toward the specimen 12 through objective lens 212. The sub-beam passed by the beam-splitting steering mirror 204 is received by beam steering mirror 226, which directs the sub-beam through the viewport 16 to mirrors 228, 230, and 232 toward the specimen 12 through an objective lens 234. The images received by the camera 220 resemble those of FIG. 2.

The two beam steering mirrors 204 and 226 are independently controlled to each direct their received sub-beam onto its respective side of the specimen 12 for pulsing (and scanning), and direct their sub-beam off of the specimen 12 otherwise. Since the sub-beams incident on the specimen are independently generated, the pulse energy of one sub-beam may differ from the other, leading to differing degrees of evaporation on the opposite sides of the specimen 12 and uneven erosion of the specimen 12. This issue is addressed by the variable attenuator 236 in the path of the stronger sub-beam reflected from the beam-splitting steering mirror 204, which can attenuate the stronger sub-beam to provide the same ionization rate as the weaker sub-beam. Alternatively or additionally, the energy of the laser 200 can be adapted so that the pulse train along the sub-beam path from the beam steering mirror 204 provides the same ionization rate as the prior pulse train along the sub-beam path from the beam steering mirror 226. As yet another option, variable attenuators can be placed in the paths of the sub-beams reflected from both the beam-splitting steering mirror 204 and the beam steering mirror 226, which is a preferred arrangement where the beam-splitting steering mirror 204 reflects and transmits sub-beams of roughly equal strength. The use of two beam steering mirrors 204 and 226 adds considerable expense to the atom probe of FIG. 4 when compared with the atom probe of FIG. 1, and thus arrangements using a single beam steering mirror are preferred.

The arrangement of FIG. 4 could also simply be used for simultaneous pulsing of opposite sides of the specimen, subject to the disadvantages discussed previously. In such an arrangement, a slight delay between the two beams may be required to prevent interference and yet still allow both pulses to arrive at the specimen within a few picoseconds of one another, such that they can be effectively treated as one pulse during atom probe operation. The ionization rate of the sample would depend on the alignment of both beams simultaneously; thus, any given laser scan would now include at least four variables, potentially making atom probe analysis considerably more complex and time-consuming.

Figure 5:
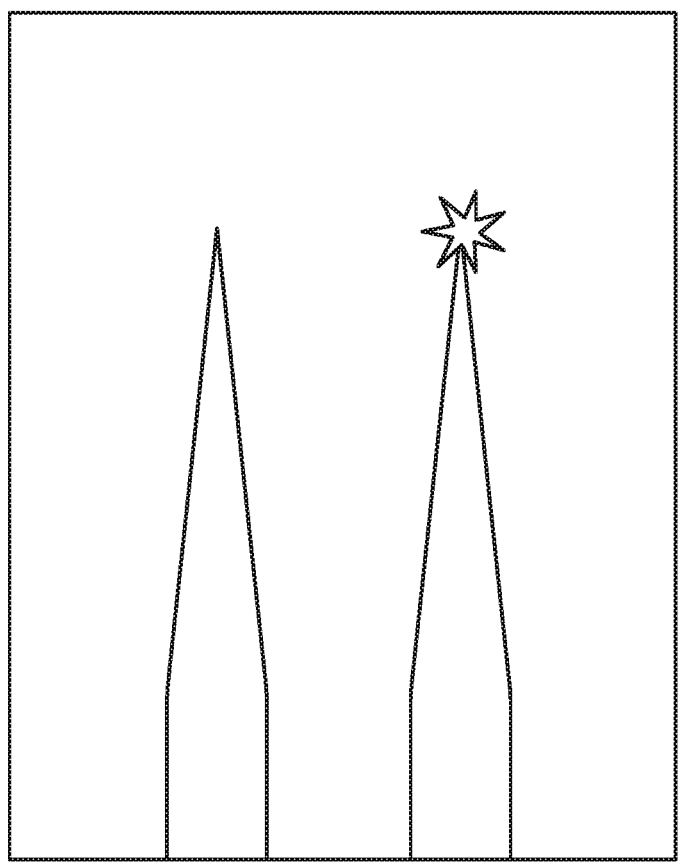
FIG. 5 is a simplified schematic view of the specimen 12 as seen by the camera 222 of FIG. 4, and showing the sub-beams being alternately positioned on the specimen 12 by the beam steering mirrors 204/226 of FIG. 1.
Figure 5:
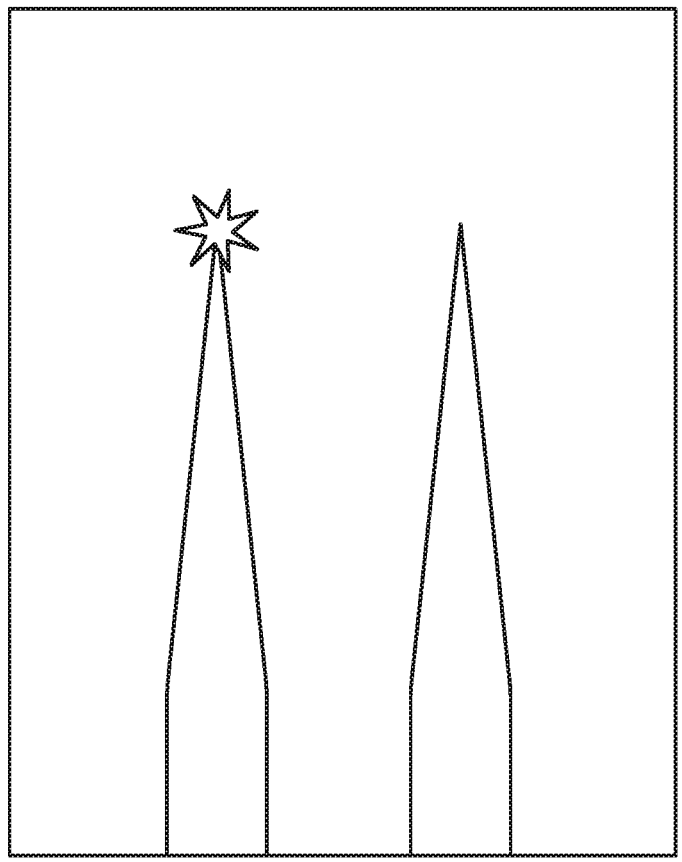

The sub-beam paths may include any suitable number of optical elements. Where the optical elements are mirrors, dove prisms, or other elements that invert an image, their numbers and arrangement along each sub-beam path can provide a camera image different from that of FIG. 2. For example, if one of the sub-beam paths of the atom probe arrangements of FIG. 1 and FIG. 4 is adapted to add or remove a mirror, the images of the specimen 12 received at the camera 122/222 will not be inverted with respect to each other. To prevent the specimen images from overlapping, the optic axes of the objective lenses 112 and 120 (as seen from the perspective of FIG. 1), and the optic axes of the objective lenses 212 and 234 (as seen from the perspective of FIG. 4), can be aligned at a slight angle with respect to the axes of the sub-beams from the mirrors 110 and 118, and the mirrors 210 and 232 (i.e., one of the lenses is oriented such that its focal axis is inclined slightly rearwardly of the specimen 12, and the other lens is oriented such that its focal axis is inclined slightly forwardly of the specimen 12). This results in the camera 122/222 receiving a pair of adjacent images of the opposite sides of the specimen 12, as seen in FIG. 5. The beam steering mirror(s) 104 and 204/226 can then "flip" the laser beam from one side of the specimen to the other in a manner similar to FIG. 2.

Other variations of the invention are possible as well. As an example, all sub-beams might be directed toward the specimen such that they would be simultaneously incident on the specimen, except beam strength adjusters in the sub-beam paths can selectively block sub-beams so that only one is incident on the specimen at a time. In this case, any beam steering mirrors would simply be used for scanning purposes, rather than for both beam-switching and scanning purposes. Here the beam strength adjusters preferably take the form of fast mechanical shutters, acousto-optic modulators, and/or electro-optic modulators, which can totally block beams incident thereon. Acousto-optic modulators and electro-optic modulators advantageously allow beams to be switched more quickly, and therefore more frequently. The switching speed of an acousto-optic modulator (~10 nanoseconds) is actually adequate to switch between sub-beams for each laser pulse (i.e., the sub-beams need not necessarily transmit pulse trains).

As another example, an atom probe as described above can include more than two beams incident on the specimen (though not simultaneously); consider, for example, extending the concepts of the atom probes of FIGS. 1 and 4 to add one or more further beam splitters and/or steering mirrors to generate three or more incident sub-beams. Preferably, where multiple sub-beams are successively incident on the specimen, they have at least approximately equal angular separation about the specimen to better ensure approximately equal degrees of specimen erosion. As examples, the two sub-beams of FIGS. 1 and 4 are 180 degrees apart about the specimen; three sub-beams would preferably be spaced 120 degrees apart about the specimen; four sub-beams would preferably be spaced 90 degrees apart about the specimen; and so forth. In each case, a plot of ionization rate vs. beam position, as in FIG. 3, will display a peak corresponding to each incident beam, and equal peak heights will indicate equal degrees of ionization (and thus equal erosion) from each beam, assuming the beams have pulse train lengths which are at least substantially similar.

The atom probe arrangements discussed above can also implement other variations, for example, those discussed in the aforementioned patents. As one example, the laser(s) or other energy beam supplies may be located within the atom probe chamber, rather than outside it. As another example, the atom probe arrangements are compatible with various types of local electrodes, such as conical or flat local electrodes, and pre-aligned local electrodes (local electrodes which are fixed in alignment with the specimen before insertion into the vacuum of the atom probe chamber). Where a local electrode is used, the sub-beams and local electrode must be situated such that the local electrode does not interfere with the sub-beams' use. Furthermore, the specimen, the sub-beams, and the counter electrode must all be properly aligned within the atom probe chamber via the use of micropositioning stages or other positioners; while feasible, this can generate complexity.

Throughout this document, where a measurement or other value is qualified by the terms "approximately," "substantially," "about," or similar terms of approximation—for example, "approximately 50 cm"—this can be regarded as referring to a variation of 10% from the noted value. Thus, "approximately 50 cm," "substantially 50 cm," or "about 50 cm" can be understood to mean between 45 and 55 cm.

When it is said that different sides of a specimen are supplied with energy "in sequence," "sequentially," or the like, it should be understood that the sequence need not be fixed, that is, the different sides need not always receive energy in the same order. It should also be understood that a "side" of a specimen need not literally be a lateral side (and typically will not literally be a lateral side, as it's typically desired that energy be delivered to the specimen's apex). In this respect, the term "location" can be regarded as synonymous with "side."

The versions of the invention described above are merely exemplary, and the invention is not intended to be limited to these versions. Rather, the scope of rights to the invention is limited only by the claims set out below, and the invention encompasses all different versions that fall literally or equivalently within the scope of these claims.

What is claimed is:

1. An atom probe including:
   a. a laser beam source, and
   b. a beam splitter situated to:
      (1) receive a laser beam from the laser beam source along a beam path, and
      (2) split the laser beam into sub-beams which travel along different sub-beam paths, the different sub-beam paths being directed toward a specimen within an atom probe chamber,
   c. a steering mirror or beam strength adjuster configured to provide:
      (1) different ones of the sub-beams incident on the specimen over time,
      (2) with only one of the sub-beams incident on the specimen at a time.

2. The atom probe of claim 1 further including:
   a. an ion detector configured to measure ion evaporation from the specimen,
   b. a processor configured to:
      (1) receive ion evaporation measurements from the ion detector, and
      (2) adjust the energy of at least one of the sub-beams to seek equal ion evaporation measurements resulting from all sub-beams incident on the specimen.

3. The atom probe of claim 2 further including one or more attenuators, each attenuator:
   a. having attenuation adjustable by the processor, and
   b. being situated along one of the sub-beam paths to attenuate the sub-beam traveling therealong.

4. The atom probe of claim 1 further including:
   a. an ion detector configured to measure ion evaporation from the specimen,
   b. one or more attenuators, each attenuator:
      (1) being situated along one of the sub-beam paths to attenuate the sub-beam traveling therealong, and
      (2) having adjustable attenuation,
   c. a processor configured to:
      (1) receive ion evaporation measurements from the ion detector, and
      (2) adjust the attenuation of at least one attenuator to seek equal ion evaporation measurements resulting from all sub-beams incident on the specimen.

5. The atom probe of claim 2 wherein the processor is configured to adjust the energy of the laser beam.

6. The atom probe of claim 1 wherein the sub-beam paths have an angular separation of at least 90 degrees, as measured about the specimen.

7. The atom probe of claim 1 wherein the sub-beam paths of the sub-beams have at least substantially equal angular separation about the specimen.

8. The atom probe of claim 1 wherein:
 a. the sub-beam paths provide at least a pair of images of the specimen along the beam path, and
 b. the images of the specimen are spaced from each other.

9. The atom probe of claim 1 further including the steering mirror between the laser beam source and the beam splitter, the steering mirror being adjustably repositionable to effect changes in the sub-beam paths.

10. The atom probe of claim 9 wherein the steering mirror is repositionable to selectively direct the sub-beam path of any selected one of the sub-beams onto the specimen, such repositioning directing the sub-beam paths of the other sub-beams off of the specimen.

11. The atom probe of claim 1 wherein:
 a. each sub-beam path includes an objective lens between the steering mirror and the specimen, and
 b. the optical axes of the specimen lenses intersect at a location offset from the specimen.

12. A method for collecting atom probe data including the steps of:
 a. splitting a laser beam into sub-beams which travel along different sub-beam paths,
 b. directing the sub-beams toward a specimen within an atom probe chamber, with:
  (1) different sub-beams falling incident on the specimen over time, and
  (2) only one of the sub-beams being incident on the specimen at a time.

13. The method of claim 12 further including the steps of:
 a. scanning each sub-beam over an area of the specimen; and
 b. monitoring ion evaporation from the specimen during the scanning.

14. An atom probe data collection arrangement including:
 a. a laser beam source;
 b. a steering mirror situated to receive a laser beam from the laser beam source;
 c. a beam splitter situated to receive the laser beam from the steering mirror, wherein the beam splitter splits the laser beam into sub-beams which travel along different sub-beam paths toward a specimen;
 wherein the steering member is adjustable to selectively direct any selected one of the sub-beams onto the specimen, such selectable direction directing the other sub-beams off of the specimen.

15. The arrangement of claim 14 further including:
 a. an ion detector configured to measure ion evaporation from the specimen,
 b. a processor configured to:
  (1) receive ion evaporation measurements from the ion detector, and
  (2) adjust the energy of at least one of the sub-beams to seek equal ion evaporation measurements resulting from all sub-beams incident on the specimen.

16. The arrangement of claim 15 further including one or more attenuators, each attenuator:
 a. having attenuation adjustable by the processor, and
 b. being situated along one of the sub-beam paths to attenuate the sub-beam traveling therealong.

17. The arrangement of claim 14 further including:
 a. an ion detector configured to measure ion evaporation from the specimen,
 b. one or more attenuators, each attenuator:
  (1) being situated along one of the sub-beam paths to attenuate the sub-beam traveling therealong, and
  (2) having adjustable attenuation,
 c. a processor configured to:
  (1) receive ion evaporation measurements from the ion detector, and
  (2) adjust the attenuation of at least one attenuator to seek equal ion evaporation measurements resulting from all sub-beams incident on the specimen.

18. The arrangement of claim 14 wherein the sub-beam paths have an angular separation of at least 90 degrees, as measured about the specimen.

19. The arrangement of claim 14 wherein:
 a. the sub-beam paths provide at least a pair of images of the specimen along the beam path, and
 b. the images of the specimen are spaced from each other.

20. The arrangement of claim 14 wherein:
 a. each sub-beam path includes an objective lens between the steering mirror and the specimen, and
 b. the optical axes of the specimen lenses intersect at a location offset from the specimen.

\* \* \* \* \*